United States Patent
Oldenkamp (10) Patent No.: US 12,199,565 B2
(45) Date of Patent: Jan. 14, 2025

(54) SOLAR MODULE HAVING LONG SOLAR STRINGS

(71) Applicant: Solarnative GmbH, Frankfurt (DE)

(72) Inventor: Hendrik Oldenkamp, The Hague (NL)

(*) Notice: Subject to any disclaimer, the term of this patent is extended or adjusted under 35 U.S.C. 154(b) by 1 day.

(21) Appl. No.: 17/778,421

(22) PCT Filed: Oct. 17, 2020

(86) PCT No.: PCT/DE2020/000250
§ 371 (c)(1),
(2) Date: May 20, 2022

(87) PCT Pub. No.: WO2021/098895
PCT Pub. Date: May 27, 2021

(65) Prior Publication Data
US 2023/0006606 A1    Jan. 5, 2023

(30) Foreign Application Priority Data
Nov. 20, 2019 (DE) .......... 10 2019 008 062.9

(51) Int. Cl.
*H02S 50/10* (2014.01)
*H02S 40/34* (2014.01)

(52) U.S. Cl.
CPC .......... *H02S 50/10* (2014.12); *H02S 40/34* (2014.12)

(58) Field of Classification Search
CPC ........ G01D 5/147; H03K 17/97; H03K 17/90; G01R 33/0023; G01R 33/0029; G01R 33/07; H02S 50/10; H02S 40/34; H02S 50/00; Y02E 10/50; H01L 31/02021
See application file for complete search history.

(56) References Cited

U.S. PATENT DOCUMENTS

| | | | |
|---|---|---|---|
| 2008/0143188 A1* | 6/2008 | Adest | H02M 7/42 307/82 |
| 2008/0198523 A1 | 8/2008 | Schmidt | |
| 2012/0228947 A1* | 9/2012 | Noy | H02J 7/35 307/80 |
| 2012/0325288 A1* | 12/2012 | Jang | H02S 40/32 136/246 |
| 2013/0163137 A1* | 6/2013 | Johnston | H01L 31/0504 361/91.1 |
| 2018/0115275 A1* | 4/2018 | Flanigan | H02S 20/25 |
| 2019/0036481 A1* | 1/2019 | Chapman | H02M 3/33573 |
| 2019/0165193 A1* | 5/2019 | Han | H02M 7/44 |

FOREIGN PATENT DOCUMENTS

DE    102009051186    5/2010

* cited by examiner

*Primary Examiner* — Giovanni Astacio-Oquendo
*Assistant Examiner* — Haidong Zhang
(74) *Attorney, Agent, or Firm* — JMB DAVIS BEN-DAVID (57) ABSTRACT

The present invention relates to an electronic circuit for photovoltaic modules, which circuit ensures that the magnitude of the reverse voltage of each solar cell in a solar module does not exceed a particular value at any time. The problem solved by the invention is that of ensuring that the electrical voltage of each solar cell string within the photovoltaic module does not fall below a particular value.

4 Claims, 9 Drawing Sheets

SOLAR MODULE HAVING LONG SOLAR STRINGS

CROSS-REFERENCE TO RELATED APPLICATION

This is the U.S. National Stage of International Patent Application No. PCT/DE2020/080406 filed Oct. 17, 2020, which claims priority to German Patent Application No. 10 2019 008 062.9 filed Nov. 20, 2019.

FIELD OF THE INVENTION

The present invention relates to the interconnection of solar cells in solar modules (also called photovoltaic modules) and to the prevention of high reverse voltages at these solar cells.

PRIOR ART

Figure 1:
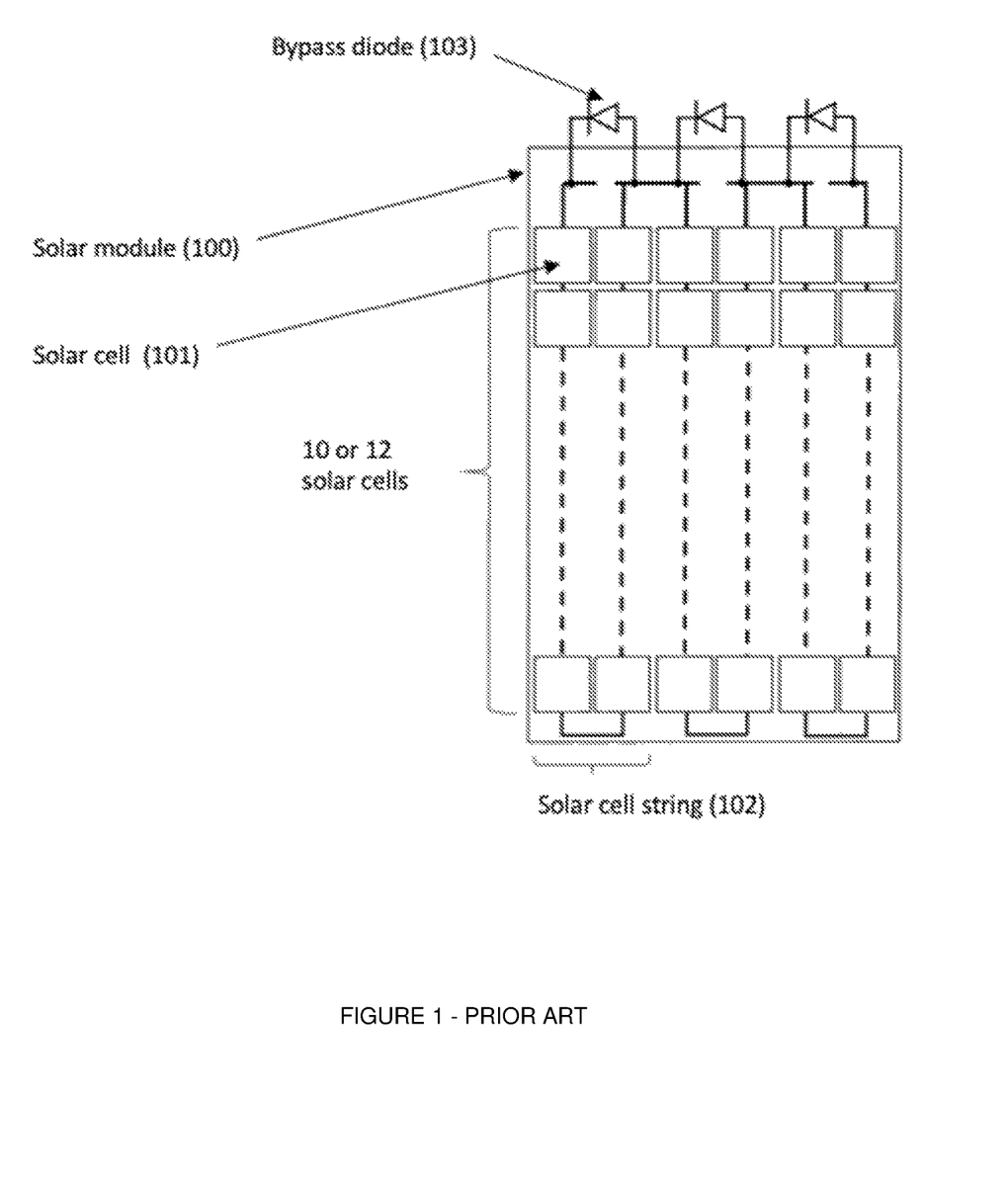
FIG. 1: Schematic illustration of a solar module (100) consisting of solar cells (101) grouped in typically 3 solar cell strings (102). Each solar cell string is antiparallel interconnected with a bypass diode (103).

Solar cells (101) are interconnected in solar modules (100) according to the state of the art as shown in FIG. 1. Solder ribbons are used to electrically conductively connect the front side of a solar cell, which simultaneously represents the negative pole of this solar cell, to the rear side (positive pole) of the following solar cell.

Typically, all solar cells within a solar module are interconnected in series. Commercially available solar modules use 60 or 72 solar cells. The layout then consists of 6×10 or 6×12 solar cells.

Typically, three solar cell strings (102) are used in solar modules, each with 2×10 or 2×12 cells as shown in FIG. 1. Each solar cell (101) has an open circuit voltage of 650-700 mV. This results in an open circuit voltage of 39-42 V per solar module when using 60 cells per module and an open circuit voltage of 46.8-50.4 V when using 72 cells per module. In the following, an open-circuit voltage of 40 V and the use of 60 cells per module is assumed for the sake of simplicity.

In a photovoltaic system, solar modules are interconnected. The solar modules and cables are approved for a maximum system voltage of typically 1000 V or 1500 V. Depending on the maximum system voltage, the maximum number of solar modules that can be interconnected in series in a module string is determined. At 1000 V system voltage and 40 V module voltage, a maximum of 25 modules may be interconnected in series in one module string.

Given that the open-circuit voltage of the solar cells is temperature-dependent and increases by approx. 0.3% per degree Kelvin as the temperature drops, the maximum number of modules still depends on the minimum temperature for which the system is specified. When specified for −25° C., the module open-circuit voltage increases by 0.3%/K*50K*40 V=6 V compared to the standard temperature of +25° C. This means that with a maximum string voltage of 1000 V, only 21 modules may be interconnected in series.

This means that in this module string a total of N=60× 21=1260 solar cells are interconnected in series.

Due to the serial interconnection, the same current flows through all of these 1260 solar cells. Now the current of a solar cell depends on its quality, its area and its illumination. In a photovoltaic system, sorted solar cells of the same quality and area are used. However, the illumination of the solar cells can vary, e.g. due to shading of a (partial) solar cell. Shading can be caused by clouds, interfering objects or contamination.

Figure 2:
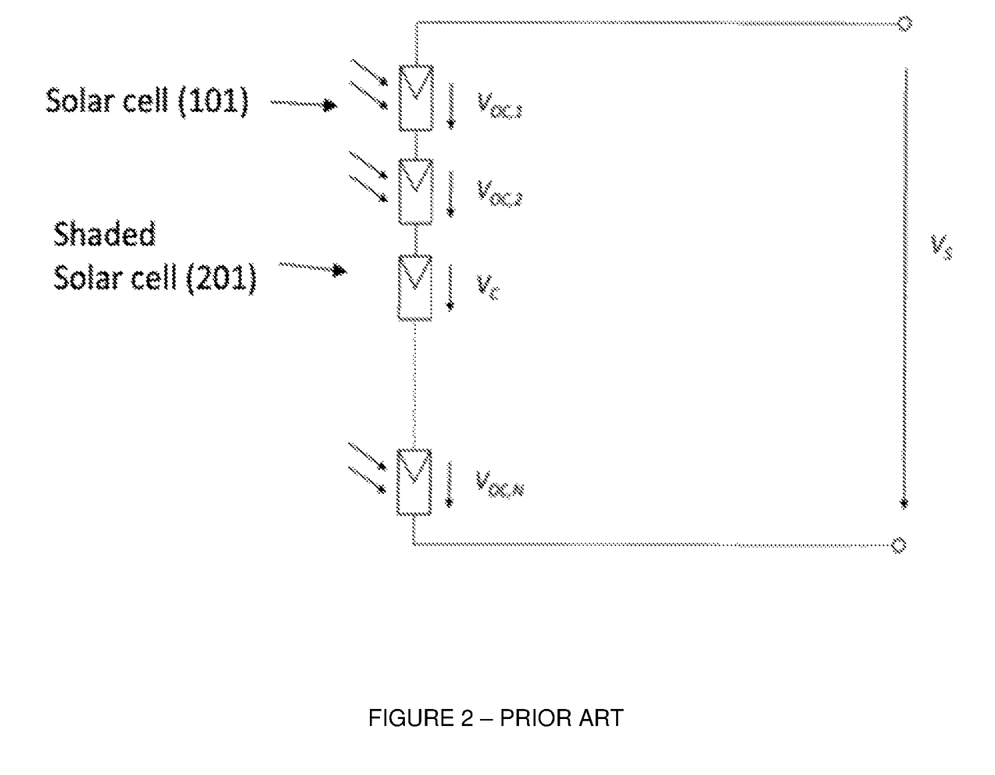
FIG. 2: Equivalent circuit diagram of N solar cells (101) interconnected in series. If a solar cell (201) is shaded, it blocks and the string current approaches zero. The illuminated solar cells are then in open circuit and supply their open circuit voltage $V_{oc}$. The string voltage V, also becomes zero.

In case of shading of a solar cell—for the sake of simplicity, it is assumed that one cell is completely shaded, while all others are not shaded at all—the shaded solar cell (201) behaves like a diode in the dark and blocks, i.e. no current flows. Thus, no current flows in the entire string. As shown in FIG. 2, the string voltage $V_s$ at the load is then zero and all other (illuminated) solar cells (101) in the string supply their open-circuit voltage $V_{oc}$=0.67 V. In the closed mesh of the entire string, the voltage $V_c$ of the shaded solar cell is then:

$$V_c = V_s - (N-1)V_{oc} = -(N-1)V_{oc} = -1295 V_{oc} = -839 V$$

Such a high voltage in reverse direction would destroy the solar cell, avalanche breakdown of the junction would occur, especially, at so-called hotspots—local short circuits in the junction. To avoid this and at the same time prevent shading of individual solar cells from affecting the current and thus the performance of entire strings, solar modules are typically equipped with so-called bypass diodes (103), which are interconnected anti-parallel to a certain number of solar cells: The maximum reverse voltage that a solar cell can tolerate on a sustained basis is in the −13 V range. This means that each bypass diode may be interconnected in parallel to a maximum of 20 solar cells.

Figure 3:
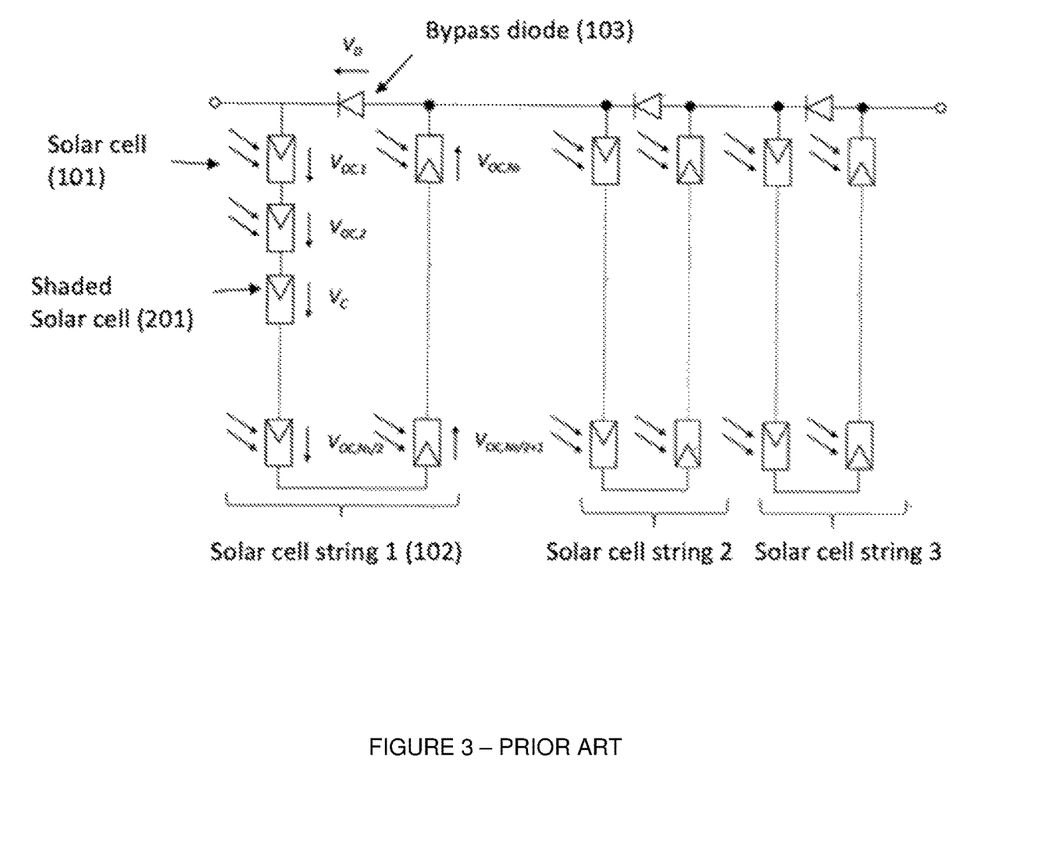
FIG. 3: Equivalent circuit diagram of a solar module (100) consisting of three solar cell strings (102), each with $N_s$ solar cells (101). Each solar cell string is interconnected in anti-parallel with a bypass diode (103). If a solar cell (201) is shaded, it blocks and the string current approaches zero. The illuminated solar cells are then in open circuit and supply their open circuit voltage $V_{oc}$. The string voltage is equal to the diode voltage −$V_D$.

FIG. 3 shows the equivalent circuit diagram of a solar module with 3 solar cell strings and 3 bypass diodes. In the normal case, when all cells experience the same irradiation, the voltage of the $N_s$=20 solar cells of the cell string is applied to each bypass diode in the reverse direction. Thus, at the operating point of maximum power, the diode voltage is $V_D = -N_s * V_{oc} = -13.3$ V. The diode blocks and does not affect the operation of the solar cells.

In the event that one cell is shaded, the current through the cell string is zero amps. The current of the other modules is then driven through the bypass diode. The diode becomes conductive and only approx. 0.5 V diode voltage drops. At the shaded solar cell, the voltage $$V_c = -V_D - (N_s - 1)V_{oc} = -V_D - 19 V_{oc} = -13,2 V$$

is then present. This voltage is not dangerous for the solar cell and the solar module if it does not have extreme hotspots. Also the case of 72-cell modules is still uncritical for most cell types.

More cells cannot be interconnected in parallel to a bypass diode without endangering the cells. This would not be desirable for 60-cell or 72-cell modules, since in a typical system the bypass diodes already switch to bypass when only 10% of a solar cell, i.e. less than 0.2% of the module area, is shaded. In the bypass case, one loses the complete power of a cell string of e.g. 1 10 W for a 3, 30 W module. Additional loss of 5 W is caused by the voltage drop of 0.5 V at the bypass diode.

Figure 4:
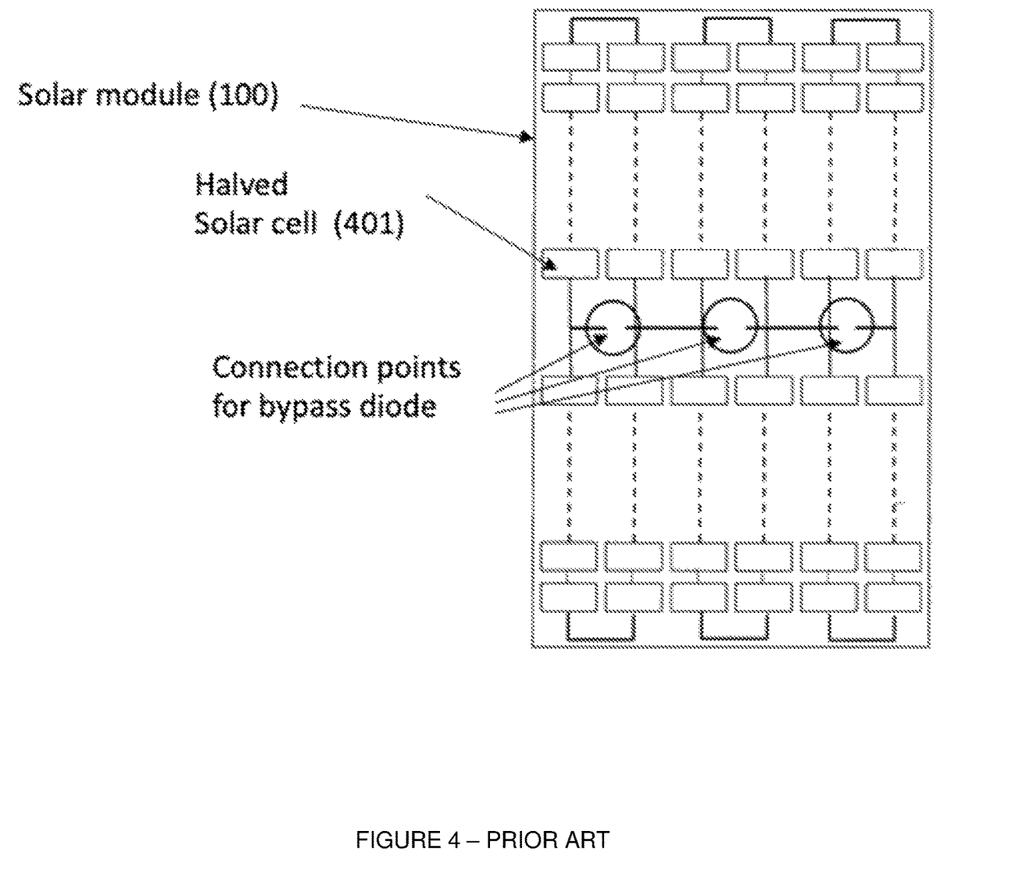
FIG. 4: Schematic illustration of a solar module (100) consisting of halved solar cells (401). To prevent the solar cell strings from becoming too long, the solar module is divided into an upper and a lower half. The bypass diodes (103) are arranged in the center of the module so that one upper string and one lower string are interconnected in parallel and the bypass diode is interconnected antiparallel to these two strings.

More difficult than 60-cell modules is the case of modules with half cells. With this technology, the solar cells are halved. Instead of a current of approx. 10 A, they only deliver approx. 5 A. As a result, the resistive losses in the cell connectors are quartered and the power per module increases by 6-7 W. If the halved cells were used in a standard module layout, this would mean connecting 40 solar cells instead of 20 solar cells per bypass diode. This would double the reverse voltage of the cells in the shading case. To get around this problem, half-cell modules are typically interconnected in a half-module format. Here, the module is divided into two halves as shown in FIG. 4. In each half, 20 half cells (401) per cell string are interconnected in series and routed to a bypass diode. The bypass diodes are arranged in the center of the module so that the two halves of the module are interconnected in parallel. The disadvantage of this arrangement is the additional space required for the cross-connectors in the center of the module. This reduces the module efficiency by approx. 0.6% rel. In addition, the costs of module production increase due to the additional cross-connectors and the higher interconnection effort.

Figure 5:
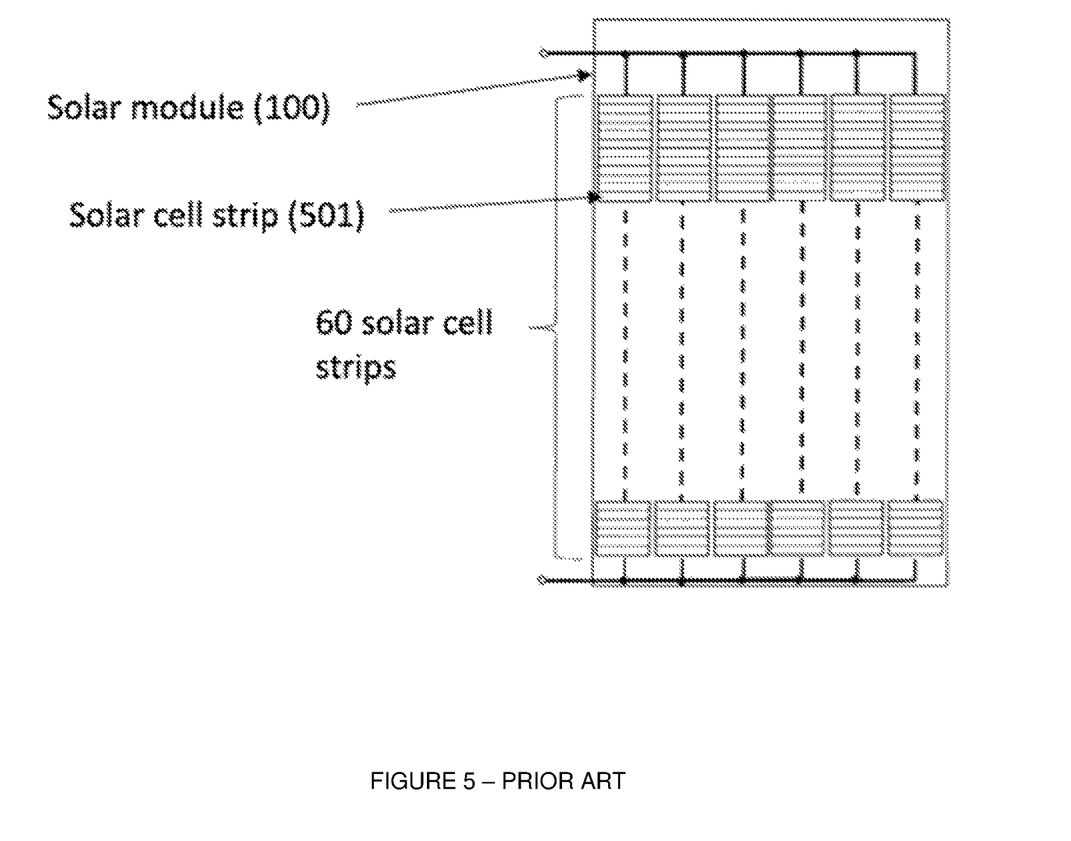
FIG. 5: Schematic representation of a solar module (100) consisting of solar cells (501) cut into strips. Each original solar cell is typically cut into 6 strips. The module has 6 strings connected in parallel, each with 60 solar cell strips (501). To prevent the reverse voltage of a solar cell strip from becoming too large in case of shading, 3 bypass diodes (not shown here) must be interconnected in anti-parallel to 20 cells respectively.

Even more complex is the consideration of bypass diodes in so-called shingle modules as shown in FIG. 5. In these modules, the solar cells are cut by laser into 5 or 6 strips (501) and these are then interconnected in series without solder ribbons. Typically, conductive adhesive is used for this purpose. For a module layout of 6×10 solar cells and vertical string direction, this results in 6 strips×10 cells=60 cell strips per string. This would be too many cells for a bypass diode. Therefore, in this case, 3 bypass diodes have to be integrated into each string. This is very costly in terms of manufacturing and requires a lot of material for the module-internal interconnection of the bypass diodes.

DESCRIPTION OF THE INVENTION

It is object of the invention to enable a module layout in which more than 20 solar cells can be interconnected in series in a solar cell string without the reverse voltage of the individual cells exceeding a certain value, for example 12 V, in the case of shading.

The invention solves the object by means of an electronic circuit (601) which ensures that the string voltage always remains above a certain value $V_{min}$.

Exemplary embodiments of the invention are described below with reference to the accompanying figures. The elements shown in the figures are not to scale. They serve to explain essential aspects of the embodiments. Complete electronic circuits and solar modules may include other elements not shown here. The features of the various embodiments can be combined with each other in any way, unless such a combination is explicitly excluded or excluded for technical reasons.

Figure 6:
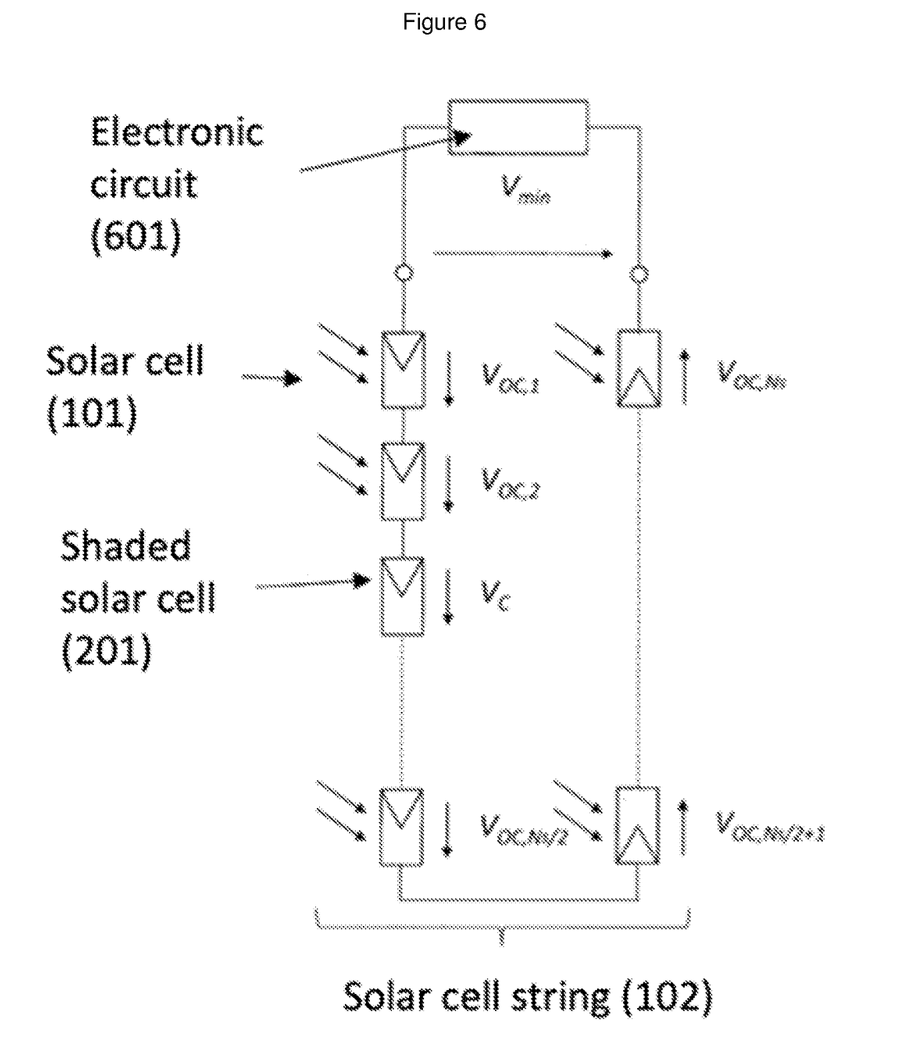
FIG. 6: Equivalent circuit diagram of a solar cell string (102) with $N_s$ solar cells (101). The string is interconnected to an electronic control circuit (601) which ensures that the string voltage never becomes lower than a minimum voltage $V_{min}$. If a solar cell (201) is shaded, it blocks and the string current approaches zero. The illuminated solar cells are then in open circuit and supply their open circuit voltage $V_{oc}$. The electronic circuit prevents the magnitude of the reverse voltage $V_c$ at the shaded solar cell (201) from exceeding a critical value.

As shown in FIG. 6, for the voltage of a shaded solar cell, it applies $$V_c = V_{min} - (N_s - 1)V_{oc}$$

Vmin is the string voltage and at the same time the input voltage of the electronic control circuit (601). If the reverse voltage of a solar cell should not exceed $V_c$=−12 V, this results in:

$$V_{min} > V_c + (N_s - 1)V_{oc} = -12V + (N_s - 1), 67V$$

Figure 7:
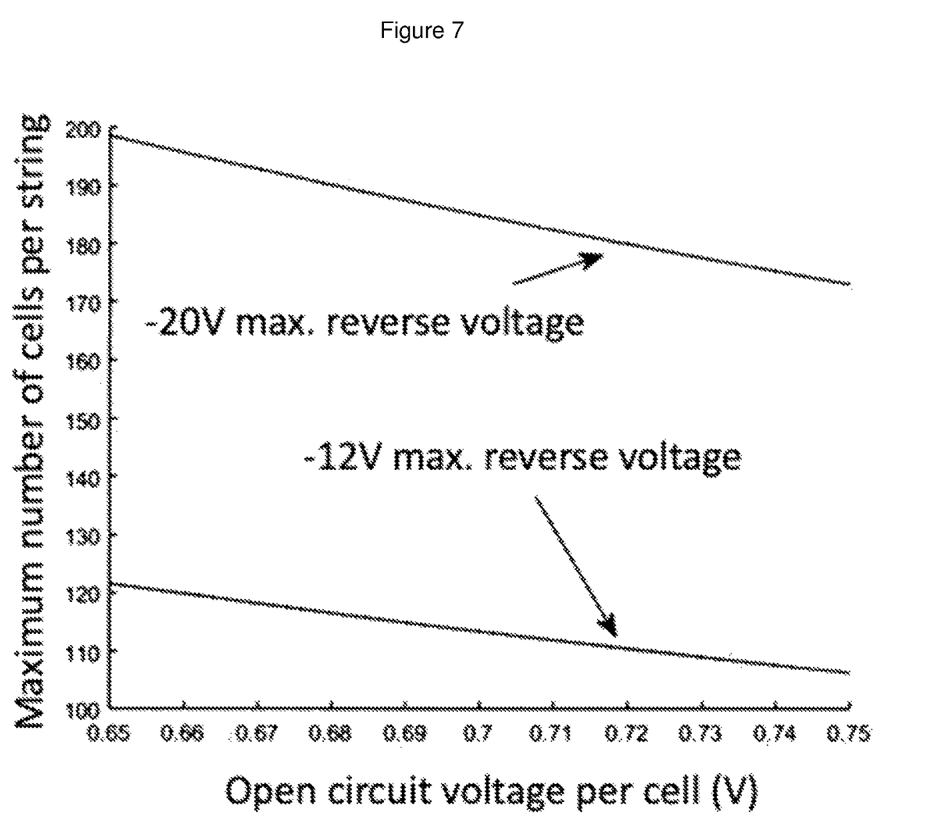
FIG. 7: Maximum number of solar cells per string as a function of the open circuit voltage of the individual solar cells, where the string voltage $V_{MPP}$ at the point of maximum power output is equal to the required minimum string voltage $V_{min}$. The curves for allowed reverse voltages on shaded solar cells of $V_c=-12V$ and $V_c=-20V$ are shown as examples.

In a string with 20 cells, $V_{min}$=0.73 V. In a string with 60 cells, $V_{min}$=27.5 V. To ensure that no power is lost in the illuminated case, $V_{min}$ should not be greater than the voltage $V_{MPP}$ at the maximum power point. For $V_{MPP}$, the following applies to typical solar modules: $V_{MPP}=N_s 0.84\ V_{oc}$. This results in a maximum number of solar cells per string as shown in FIG. 7.

Figure 8:
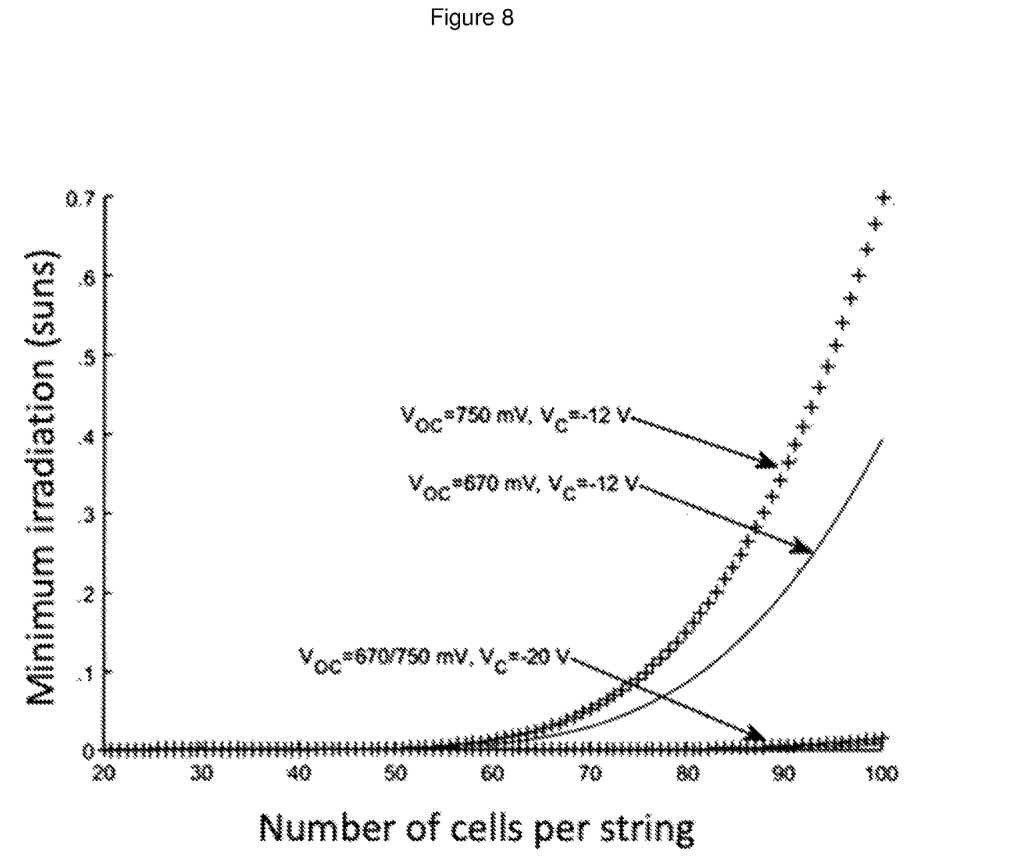
FIG. 8: Minimum irradiation above which the string voltage $V_{MPP}$ at the point of maximum power output is greater than the set required minimum string voltage $V_{min}$, depending on the number of solar cells per string. The minimum string voltage $V_{min}$ depends on the open circuit voltage $V_{oc}$ of the individual solar cells and the allowed reverse voltage Vc per solar cell. The figure shows 4 curves for different combinations of $V_c$ and $V_c$.
Figure 9:
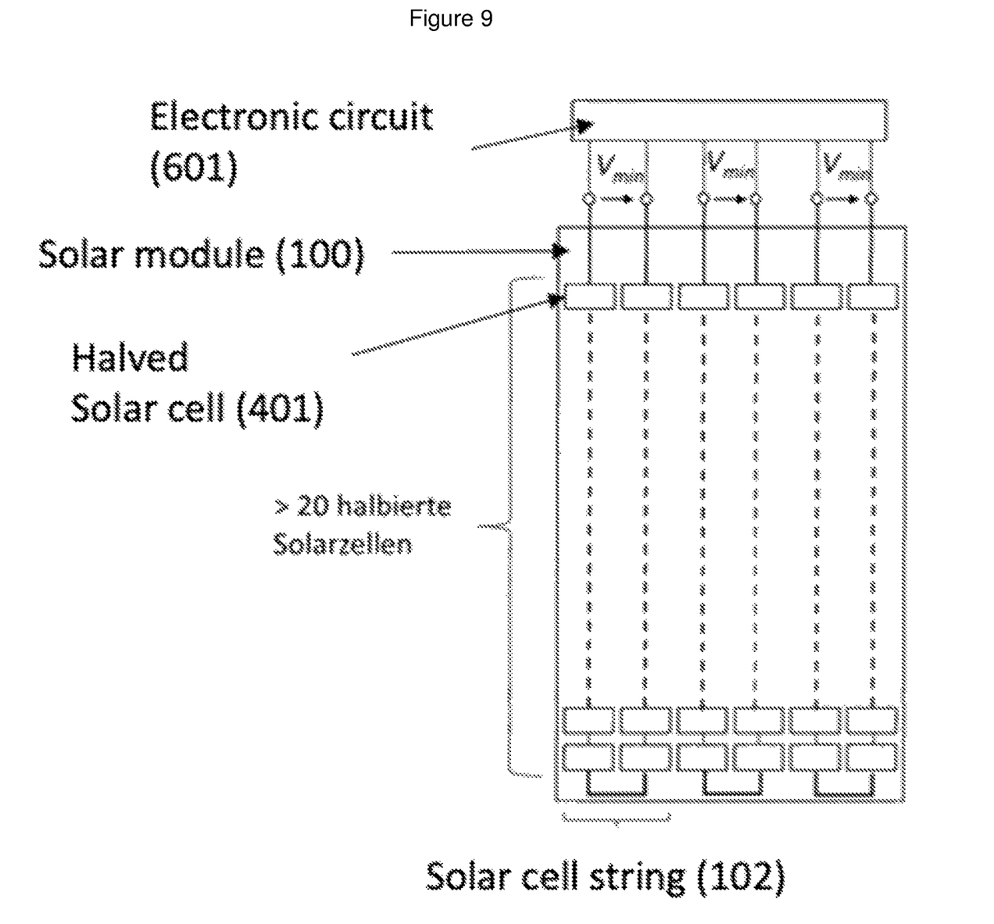
FIG. 9: Schematic illustration of a solar module (100) with three solar cell strings (102) consisting of at least 40 halved solar cells (401), all connected in series. No bypass diodes are used. Instead, the strings are equipped with electronic circuitry (602) that ensures that the string voltage on each string remains above a minimum string voltage $V_{min}$.

Since $V_{MPP}$ depends logarithmically on irradiance, the dependence of the minimum irradiance required for $V_{MPP}$ to be greater than $V_{min}$, shown in FIG. 8, results. The unit suns results from the normalized unit 1 sun=100 mW/cm², which is approximately reached in Germany in summer at noon. From the figure it can be seen that, for example, for a string length of 60 cells, the minimum irradiation must amount to approx. 0.02 suns. The open circuit voltage of the individual cells is relatively insignificant at this point. This means that the principle can be applied well, and only very slight performance losses have to be accepted. Standard 60-cell modules or shingle modules, for example, can thus be completely interconnected in this embodiment. If the number of cells per string is reduced to 40 cells in a further embodiment of the invention, the minimum irradiance is only 0.002 suns. This is the configuration as shown in FIG. 9 for half-cell modules. It is not necessary to cut the strings in half. Each string then has 40 solar cells and is connected to a separate input of the electronic circuit.

If the irradiation is lower than the minimum irradiation, $V_{MPP}$ is below $V_{min}$. The operating point thus shifts towards idle with decreasing irradiation. When the solar cells are no longer able to provide the voltage $V_{min}$, the system shuts down. In one embodiment of the invention, the electronic circuit measures the irradiance, for example by measuring the current. This allows the input voltage to be reduced as irradiance decreases, so that when there is no irradiance $V_{min}$ can become greater than $V_{MPP}$.

The open circuit voltage of solar cells is fairly linearly dependent on temperature. With increasing temperature the open circuit voltage decreases according to $$V_{oc} = V_{oc}(T=25°\ C.) - \beta(T - 25°\ C.),$$

wherein β for a solar cell is typically in the range of 0.27%/K or 1.8 mV/K. To ensure that the reverse voltage of the solar cells does not exceed 12V in the shading case even at low temperatures of, for example, −50° C., one embodiment of the invention measures the temperature and adjusts the minimum input voltage $V_{min}$ to the temperature according to $$V_{min} > V_c + (N_s - 1)V_{oc} = V_c + (N_s - 1)(V_{oc}(T_{oc}=25°\ C.) - \beta(T - 25°\ C.)).$$

In a further embodiment of the invention, the minimum input voltage $V_{min}$ is constant. In a further embodiment of the invention, the electronic circuit for controlling the string voltage is part of a larger electronic circuit, e.g., an inverter or microinverter.

Figures

The invention claimed is:

1. A photovoltaic module comprising an electronic circuit and a plurality of solar cells arranged in a plurality of solar cell strings, characterized in that the electronic circuit is configured to ensure that a magnitude of a reverse voltage of each single solar cell in the photovoltaic module does not exceed a maximum allowed reverse voltage VC at any time, even in case where one solar cell of the plurality of solar cells is shaded and all other solar cells of the plurality of solar cells are illuminated, by ensuring that an electrical voltage at each solar cell string in the photovoltaic module does not fall below a minimum string voltage Vmin, wherein Vmin is an input voltage of the electronic circuit and greater than 10 V, wherein the photovoltaic module has no bypass diodes and comprises at least three solar cell strings, each with at least 25 solar cells per solar cell string interconnected in series.

2. The photovoltaic module according to claim 1, characterized in that the magnitude of the maximum allowed reverse voltage VC per solar cell is less than 20 V.

3. The photovoltaic module according to claim 1, characterized in that the minimum string voltage Vmin is set depending on a temperature.

4. The photovoltaic module according to claim 1, wherein the input voltage is applied by the electronic circuit.

* * * * *